United States Patent [19]

Lock et al.

[11] 4,379,818

[45] Apr. 12, 1983

[54] ARTWORK ALIGNMENT FOR DECORATING MACHINE

[75] Inventors: William E. Lock, Horseheads; Edward A. Snyder, Lindley, both of N.Y.

[73] Assignee: Corning Glass Works, Corning, N.Y.

[21] Appl. No.: 332,725

[22] Filed: Dec. 21, 1981

[51] Int. Cl.³ .................... G03F 9/00; B44C 1/22; C03C 15/00; C03C 25/06
[52] U.S. Cl. ..................... 430/5; 156/218; 156/252; 156/258; 156/654; 156/658; 156/659.1; 430/323; 430/327
[58] Field of Search .............. 430/5, 323, 327, 329, 430/295; 156/157, 159, 252, 257, 258, 218, 625, 641, 654, 659.1, 658; 355/417, 122, 123, 125, 127, 132

[56] References Cited

U.S. PATENT DOCUMENTS

| | | | |
|---|---|---|---|
| 1,383,745 | 7/1921 | Newman | 156/157 X |
| 1,944,200 | 1/1934 | Webern | 430/5 X |
| 2,318,287 | 5/1943 | Brolin | 156/159 X |
| 3,649,394 | 3/1972 | Erickson | 156/641 X |

*Primary Examiner*—William A. Powell
*Attorney, Agent, or Firm*—John P. DeLuca

[57] ABSTRACT

The present invention provides a technique for aligning, cutting, wrapping and securing a flat sheet of film material to form a precision conical wrapping that will fit over a conical surface to a precise location and orientation. The film carries color separated portions of a design which may be registerably etched into the conical surface.

5 Claims, 21 Drawing Figures

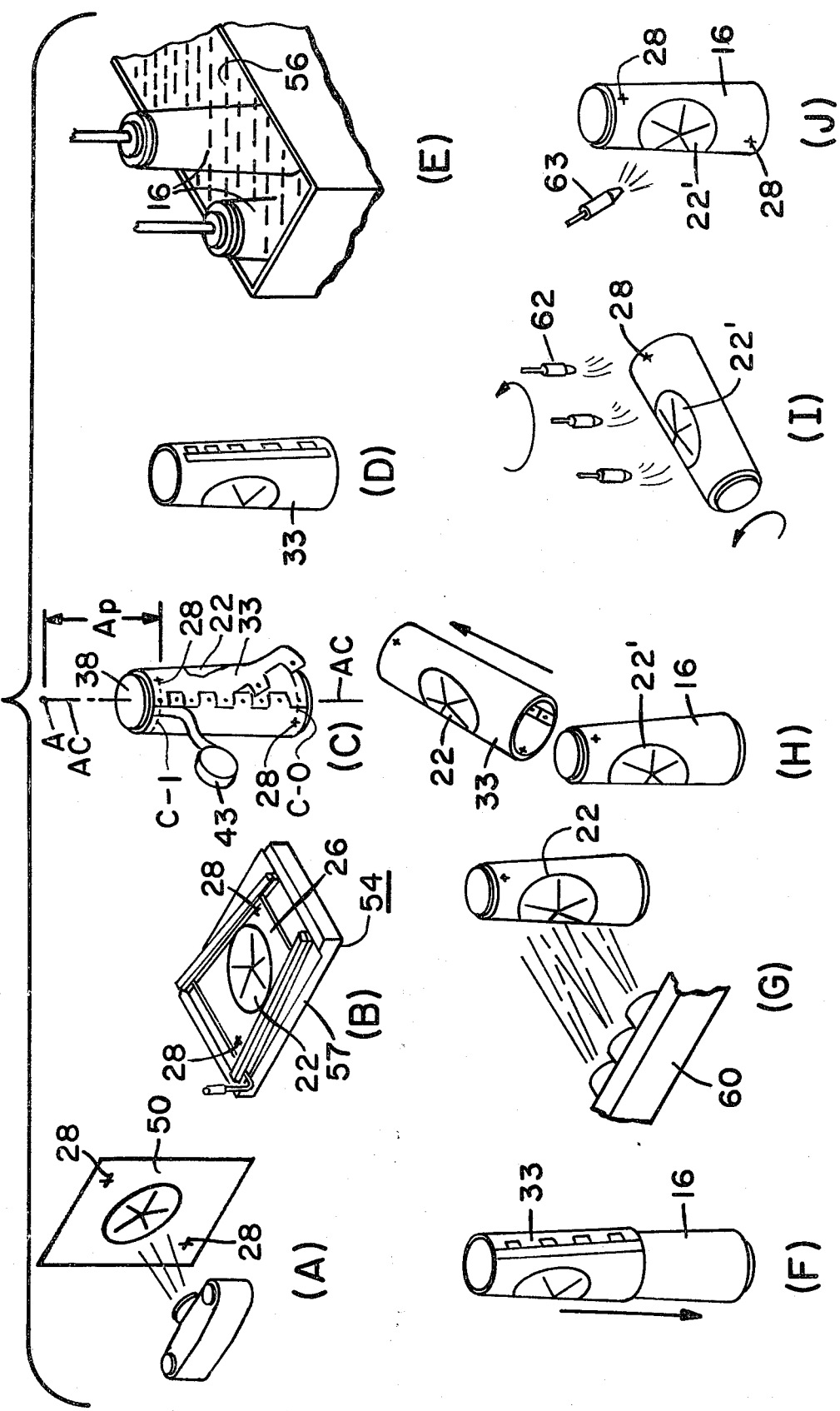

ARTWORK ALIGNMENT FOR DECORATING MACHINE

BACKGROUND OF THE INVENTION

The present invention relates to a printing apparatus and a method of carrying out various printing functions. Although many applications for the invention may be possible, the disclosure herein emphasizes the application to ware decoration. It should be understood that articles of many types may be printed or decorated using the apparatus and method of the present invention and such applications are part of the invention herein.

In multicolor ware decoration, speed, versatility, ease of setup, quality of reproduction, accuracy of registration, and cost effectiveness are important factors to consider. State of the art decorating devices approach some but not all of the above factors satisfactorily. The present invention was developed for various reasons including a desire to both take advantage of the latest ink and elastomer technology and to maximize printing rates without sacrifice of registration.

The present invention is adapted to be incorporated into a machine configuration which makes use of two geometric relationships. First, a cone when placed on the flat surface and rolled, will trace an arc centered at the same point as the apex of the cone. The cone will travel along this path freely with no slipping between the surfaces. Second, two cones sharing the same apex and placed side by side will roll one on the other without slipping along the line of contact. As will be shown below, by choosing the proper ratio of circumferences between the first mentioned cone and the arc traced in the plane of the flat surface, the cone will roll an integral number of revolutions as it travels one revolution about the traced arc. Similarly the proper choice of circumference ratios of cones will produce integral rotations with each other and the arc. Therefore, discrete locations of the cone will always match up with discrete locations along the arc in the flat surface. Accordingly, a special case of synchronous motion may be defined.

The two cones and the flat surface may be driven in synchronism by a proper gearing arrangement, from which a device may be produced which will establish pattern registration from one set of cones to another and the surface to be printed as hereinafter illustrated.

The present invention discloses a method and apparatus for accurately and repeatedly locating art work in the form of a design or pattern on the surface of a cone for subsequent etching of the pattern into the surface. The method allows the placement of a number of accurately repeated color separated patterns on a number of like cones with accurate color to color registration.

It should be further understood that the printing or decorating device described herein and in other related U.S. Patent applications referred to below may be operated in various ways to establish a degree of versatility not heretofore available in the prior art. The printing device herein only generally described may be adapted for printing multicolor designs on flat, hollow, and other odd shaped ware inside or out, with high quality, speed, and simplified set up for each of the various types of ware to be decorated.

In a series of related U.S. patent application Ser. Nos. 332,722; 332,723; 332,724 and 332,726 filed this same date and assigned to the assignee herein various embodiments of a printing or decorating machine and sub-combinations thereof for use with the present invention are disclosed in detail. It should be understood that, to the extent necessary, the teachings of said applications should be considered incorporated by reference herein.

SUMMARY OF THE INVENTION

The present invention provides a technique for aligning, cutting, wrapping and securing a flat sheet of film material to form a precision conical wrapping that will fit over a conical surface to a precise location and orientation. The film carries color separated portions of a design which may be registerably etched into the conical surface.

DESCRIPTION OF THE DRAWINGS

FIGS. 1-3(A)-(C) show geometric relationships between the various machine components and illustrate the operating principle of the apparatus wherein the present invention is utilized.

FIGS. 5(A-J) is a schematic of the steps and components utilized in carrying out the present invention.

DESCRIPTION OF THE PREFERRED EMBODIMENT

Figure 1:
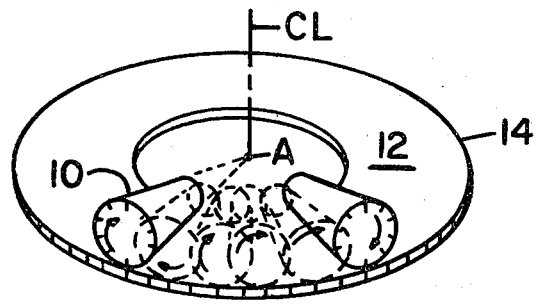

The present invention is particularly adapted for use with a machine configuration which makes use of two geometric relationships. First, referring to FIG. 1, a cone 10 (truncated as shown), having an apex point A, when placed on a flat surface 12 and rolled, will trace a circular arc or disk 14 centered at the same point as the apex A of the cone 10. The cone 10 will travel along this path freely with no slipping. Second, referring to FIG. 2, (shown in transparency), two cones, the first mentioned 10 above and another 16 having the same apex A and placed side by side, roll one on the other with no slipping along the line of contact 18.

Figure 2:
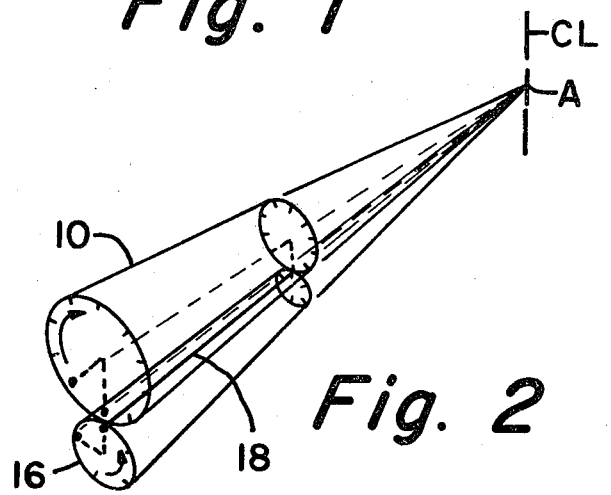
Figure 3:
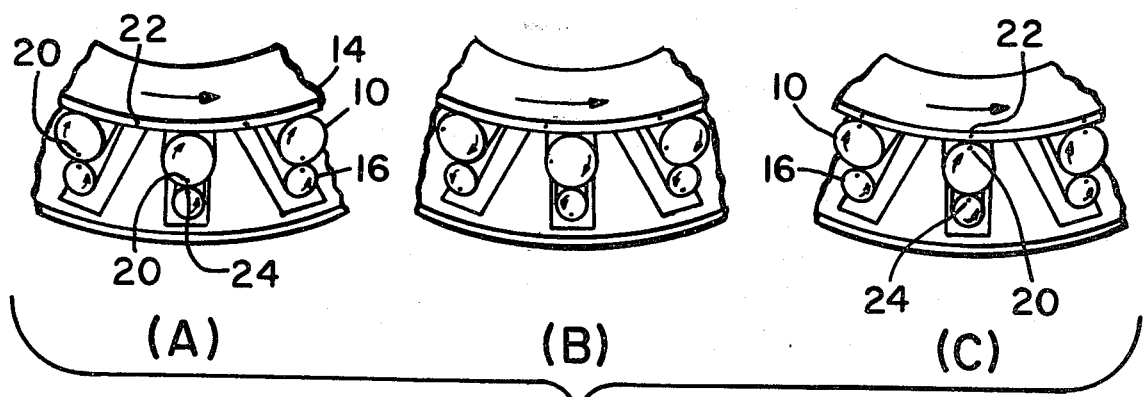

FIG. 3 at (A)-(C) illustrates that by combining the principles of FIGS. 1 and 2 and by choosing the proper ratio of circumferences between the disk 14 and cone 10, the latter will roll an integral number of revolutions as it travels one revolution around said disk 14. This means that discrete locations 20 on the cone 10 will always match up with the discrete locations 22 on the disk 14. Likewise by choosing the proper ratios of circumferences between the two cones 10 and 16, one will rotate an integral number of times for each revolution of the other. Thus, discrete locations 24 on the cone 16 will always match those discrete locations 20 on cone 10 as the cones are continuously rotated. The cones 10 and 16 may be geared one to the other and positively driven at the no slip ratio.

In the description below, cone 16 will be hereinafter sometimes referred to as etch cone and the other as transfer cone 10. Etch cone 16 has a portion of a multi-component multicolor design configuration etched into its surface and as in a conventional gravure roll, it may be supplied with ink and doctored to develop a color separated portion of design for transfer via roll 10 to a collector surface. The latter, carried in flat surface 12 of disk 14, similarly receives additional color separated portions of the design by subsequent contact with other transfer surfaces 10 which have been likewise contacted with etch cones carrying corresponding color separated design portions. In the present invention means is provided for registerably locating each corresponding design portion on separate etch cones 16 so that when operated in synchronism the colors of the design as finally envisioned will accurately reproduce the multi-component design as a reassembled composite. In the description below, the process and apparatus necessary to produce each separate color portion of the design will be described emphasizing the manner in which each design portion is maintained in registration with every other one throughout the process.

Since the engraved etch cones 16 in the machine configuration are new, i.e., conical as opposed to cylindrical, the new shape required the development of a new technique to place design portions accurately thereon. The disclosure teaches the techniques whereby a series of color separated art work film positives, all accurately registered one to another may be placed to the same relative position on a series of such cones and thus provide accurate film to film printing registration.

Although the differences with conventional processing of gravure rolls will become apparent hereinafter, the cones to be etched are conditioned in a manner very similar to that of a gravure cylinder: (1) its surface is treated with a photo-resist chemical; (2) an artwork pattern (photofilm positive or negative) is placed over the surface; (3) the photo-resist coated cone (with its film wrapping) is exposed to light which "sets" the photo-resist in all places exposed to the light and not covered by decoration on the film positive; (4) the film is thereafter removed from the cone and the photo-resist that was beneath the decoration of the film and not fixed by the light is washed from the cone, leaving uncoated areas exposed for attack by an acid spray; (5) the cone is sprayed with acid solution and the decorative pattern is etched into the surface thereof; and (6) the cone surface is then washed clean of acid and resist. The etched cone surface is the result.

This invention provides a technique to align, cut, wrap, and secure a flat piece of film (e.g. mylar) to form a precision conical wrapping that will fit a solid cone to a precise location and orientation.

Figure 4:
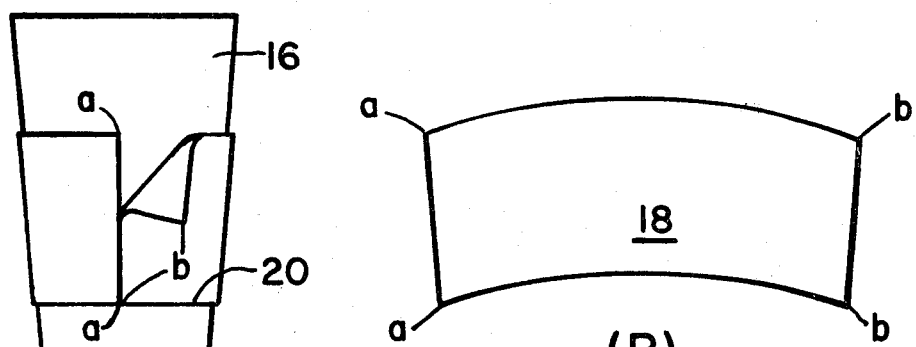
FIGS. 4A-4F show process steps for making a photomask in the form of a conical shell.
Figure 4:
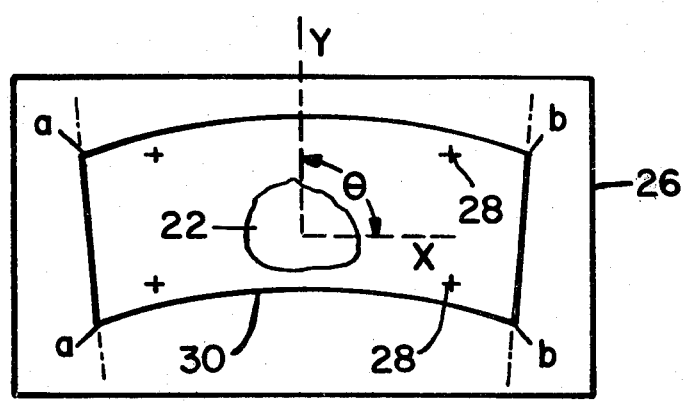
Figure 4:
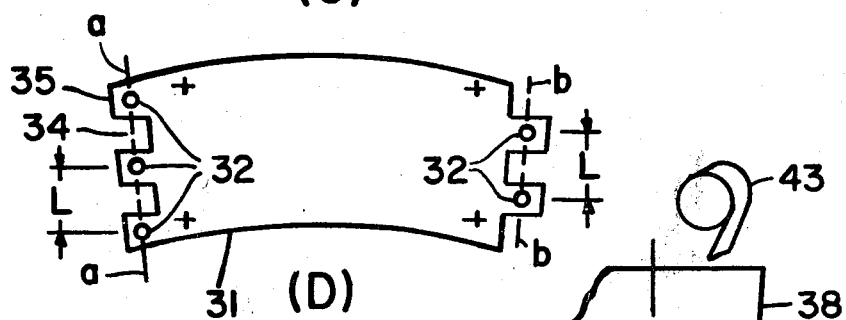
Figure 4:
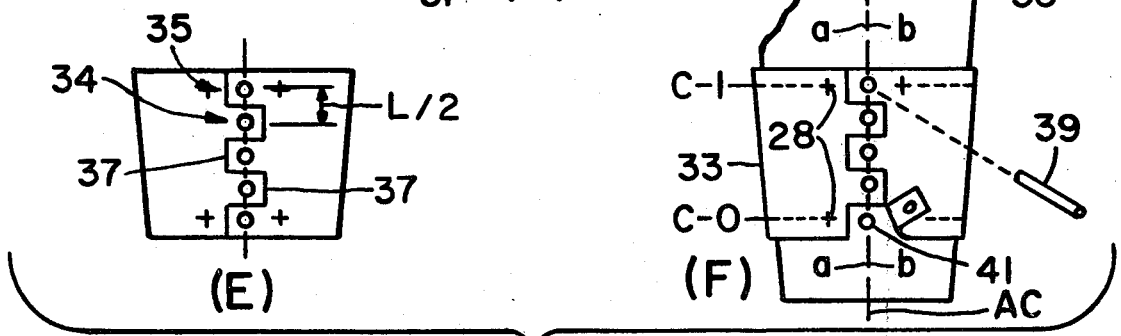

Referring to FIGS. 4A–F a portion of the surface of etch cone 16 (FIG. 4A) to be treated may be defined by a flat surface development 18 (FIG. 4B). When the flat surface development 18 is wrapped to place edge aa, on bb, the result is a thin shell cone 20. The accuracy with which edge aa and bb can be wrapped and aligned will determine how closely to the geometrically exact description of the cone 16 and the wrapped surface 20 can be made to conform.

Referring now to FIG. 4C, a color separated portion 22 of a design, sometimes hereinafter referred to as image 22, is placed photographically by conventional means onto a plastic or mylar film positive or negative film 26. The image 22 of this film 26 is oriented and positioned accurately with respect to reference or registration marks 28 that have themselves been carefully positioned with respect to a defined outline 30 of the flat surface development 18 for the cone to be wrapped. The image 22 can be accurately placed on the film 26 with respect to an x-y coordinate system. Rotation angle θ of the artwork 22 may be controlled. Multiple color separation patterns or images 22 of a composite design must all be accurately positioned with respect to the same registration marks 28 (and outline 30 of cone development 18).

To accurately form wrapped surface 20 a series of alternating holes 32 are punched through the film 26 centered along edges aa and bb. Mating notches 34 and tabs 35 are formed overlapping edges aa, and bb, and the film 26 is trimmed to the outline 31 as shown in FIG. 4D. The holes 32 in the film 26 centered along both edges aa and bb may be equally spaced at a distance (L) therebetween so that when the notched film is wrapped into a conical shell 33, notches 34 and tabs 34 closely mate and the holes 32 fall along a straight line hole pattern with spacing L/2 (see FIG. 4E). Note that the notches 34 and tabs 35 are cut to a dimension that will leave a small clearance or space 37 between mating edges of notches 34.

In order to assure alignment of all design portions 22 the cut film 31 may be wrapped around a master cone or fixture 38 to form the conical shell 33. The master cone 38 matches the geometric configuration of each etch cone 10. Removable pins 39 are located in holes or bores 33 in the fixture 38. The film 31 is wrapped about fixture 38 with pins 39 removed. The holes 32 are lined up with bores 41 and thereafter pins 39 are inserted thereby exactly positioning the holes 32 of each edge aa, bb to the straight line hole pattern. The two edges may be secured by tape 43 and the pins 39 removed. The shell 33 is then removed from the fixture 38. The resulting wrapped surface or shell 33 defines one and only one cone surface having an apex A coincident with that of the master cone or fixture 38 and all matching etch cones 16.

The cones 16 may be synchronized and aligned with other similar cones in the decorating machine by means of leveling and alignment devices (not show but described in Ser. No. 332,724 referred to above).

Registration marks 28 lie at respective positions on the surface of shell 33 defined by a respective circumference Ci (inboard) and Co (outboard). Each respective circumference Ci and Co defines an axial position along an axis AC of fixture 38. The shell 33 may thus be placed at a single location and orientation with respect to any matching cone surface. The accuracy and repeatability of placement has been determined by placement accuracy of the image 22 on the film 26, and the subsequent alignment, punching and notching and taping thereof to form a photomask in the form of the shell 33.

This precision surface is a self aligning sleeve or shell 33 that will fit over and position itself to one distinct axial location of a solid cone with a matching cone angle.

In FIG. 5 positions (A–J) the process steps involved in making an etched cone is shown as follows:

(A) color separated artwork 50 including reference marks 28 is photographed, image 22 on film 26 is developed and enlarged if necessary.

(B) then developed film 26 is aligned, trimmed, punched and notched in fixture 54.

(C) the punched and notched film 26 is aligned, wrapped, pinned and taped on fixture 38 to form shell 33.

(D) the pins 39 being removed, the rolled shell 33 is removed from fixture 38.

(E) etch cones 16 are treated in a bath of photoresist material 56.

(F) shell 33 is placed over photoresist coated or treated cone 16.

(G) image 22 is exposed by light source 60 to set corresponding image 22 in photoresist material.

(H) shell 33 is removed from etch cone 16.

(I) each etch cone 16 is acid etched by sprayers 62 to etch corresponding image 22' in cone 16.

(J) cone 16 may be cleaned by sprayer 63 as final step and installed in decorating machine (not shown).

The technique described in this invention to make a mating "sleeve" or shell to exactly fit the solid cone enables extreme accuracies to be maintained with a very simple set-up procedure. For example, color to color registration of ±0.005 has been demonstrated with a machine prototype that used etched cones prepared with this technique. It should be noted that the ±0.005 is a combination of artwork, alignment, etch cone fabrication, machine component and machine set-up tolerance. The accuracies of film wrapping are much better than ±0.005, since variations due to wrapping are only one small part of the total build-up of tolerances.

It should be noted that the fixture 38 need not be a full cone. It need only be a fixture with an array of precisely positioned holes with removable pins to accurately pin the two edges aa and bb of the film 26 and hold them while they are taped or otherwise secured together. Further the film 26 may be either positive or negative artwork using appropriate resists for producing the design portion on the etch cone 16. Punching and notching fixture 54 may be a pair of appropriately manufactured hole punchers and notching cutters mounted in a base 57. Alternately, the notches 34 and holes 35 can be cut by hand.

While there have been described what are considered to be the preferred embodiments of the present invention, it will be obvious to those skilled in the art that obvious changes and modifications may be made therein and it is intended in the appended claims to cover all such changes and modifications as come within the true spirit and scope of the invention.

We claim:

1. In a process for engraving the surface of a conical roll with registerable color separated etched portions of a design by photographic activation of surface portions of said roll through a photomask, a method for producing said photomask comprising the steps of: exposing a photomask forming film to the color separated portion of the design to produce an image on the photomask having relatively negative and positive regions therein corresponding to said color separated portion of the design; graphically representing a planar development of the conical roll to be engraved into an outline having axial and lateral margins; superimposing the image on the film and development outline into a selected planar orientation to produce a composite film; shearing the composite film at least along the lateral margins of the development outline; fabricating a fixture for aligning the axial margins of the outline; the fixture formed of a surface support member having a shape corresponding to that of the conical roll along at least one of the lateral margins of the development outline; forming at least one aperture in the surface support member of the fixture at a selected location and forming a removable pin securable in said aperture; forming at least one aperture in the film in a position corresponding to the selected location of the apertures in the fixture; wrapping the film over the fixture; aligning at least the axial margins of the film while wrapped on said fixture; aligning the respective apertures in the film and fixture one over the other; inserting the pin through the aligned aperture to secure the film and fixture in alignment; and securing the lateral margins together in butting relation to form a conical shell corresponding to and removably sleevable over the conical surface to be etched so as to produce a photomask therefor.

2. The method of claim 1 wherein the step of shearing the composite film includes the step of producing alternating tabs and mating notches in opposed lateral margins of the outline to allow mating alignment thereof.

3. The process of claim 2 further including the step of: forming the apertures in the tabs along the lateral margins of the outline.

4. The process of claim 1 further including the step of: fabricating a cutting fixture for producing at least one of the tabs, notches and apertures in the film and aligning portions of the film and cutting fixture so that shearing occurs along the lateral margin of said film.

5. The process of claim 1 further comprising steps of; treating the surface of the roll with a photoresist material, placing the photomask thereover, exposing the photomask to radiation for activating certain portions of the treated surface, removing the mask and further treating the surface with a solution selected to be operative on the activated portions on the surface of the roll to etch said activated portions thereof.

* * * * *